(12) United States Patent
Yamagishi et al.

(10) Patent No.: US 6,305,898 B1
(45) Date of Patent: Oct. 23, 2001

(54) WAFER TRANSFER MECHANISM

(75) Inventors: Takayuki Yamagishi; Masaei Suwada; Kazunori Furukawara, all of Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 09/354,690

(22) Filed: Jul. 16, 1999

(30) Foreign Application Priority Data

Jul. 22, 1998 (JP) .................................................. 10-206082

(51) Int. Cl.[7] ...................................................... B25J 15/00
(52) U.S. Cl. .................................. 414/744.5; 414/222.01; 414/222.04; 414/806
(58) Field of Search ........................... 414/222.01, 744.4, 414/744.5, 744.6, 936, 937, 941, 806–810; 294/1.1, 103.1

(56) References Cited

U.S. PATENT DOCUMENTS

| | | | |
|---|---|---|---|
| 5,022,695 | * 6/1991 | Ayers | .............................. 294/103.1 X |
| 5,162,047 | 11/1992 | Wada et al. . | |
| 5,374,147 | 12/1994 | Hiroki et al. . | |
| 5,702,228 | * 12/1997 | Tamai et al. | ....................... 414/744.5 |

FOREIGN PATENT DOCUMENTS 0 448 316 B1    9/1996   (EP) .

* cited by examiner

*Primary Examiner*—Donald W. Underwood
(74) *Attorney, Agent, or Firm*—Knobbe, Martens, Olson & Bear, LLP

(57) ABSTRACT

A transfer mechanism is provided for placing a wafer at a prescribed position on an arm without any additional step. The transfer mechanism for transferring a workpiece into and from a storage section comprises an arm member for holding a workpiece having a projection which can be contacted with an edge of the workpiece at the tip end portion thereof, a movement mechanism for reciprocating the arm member between a retracted and an extended positions while holding the workpiece thereon to transfer the workpiece to and from the storage section, and a positioning member which is positioned in the vicinity of the arm member and can be contacted with the edge of the workpiece for positioning the held workpiece in a prescribed position on the arm member. When the arm member is moved to the retracted position by the movement mechanism, the positioning member comes into contact with the edge of the workpiece held on the arm member to block only the movement of workpiece, thereby placing it in a prescribed location on the arm member.

12 Claims, 8 Drawing Sheets

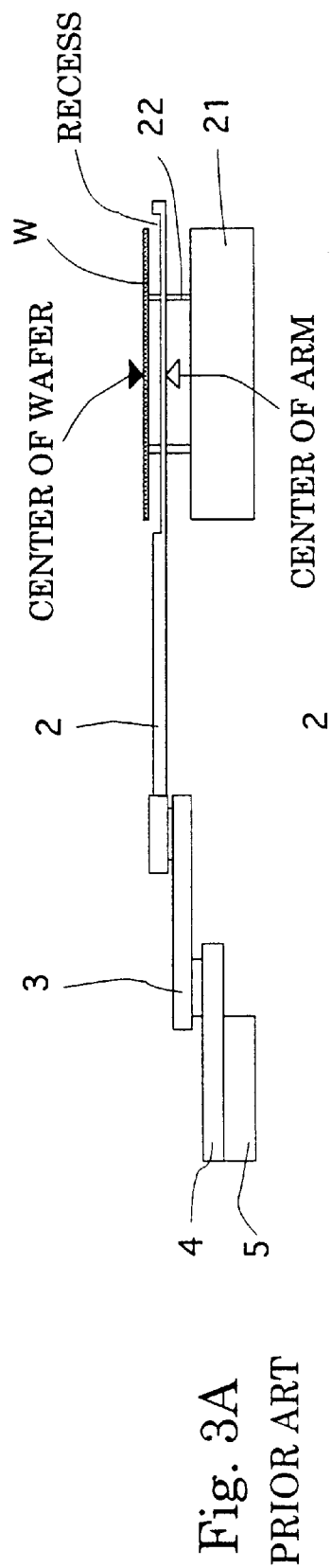
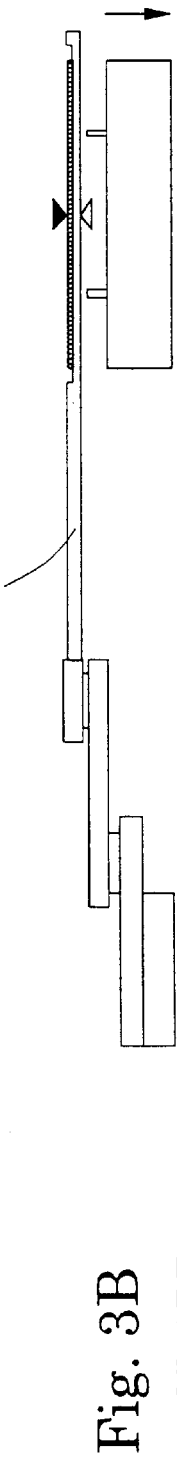
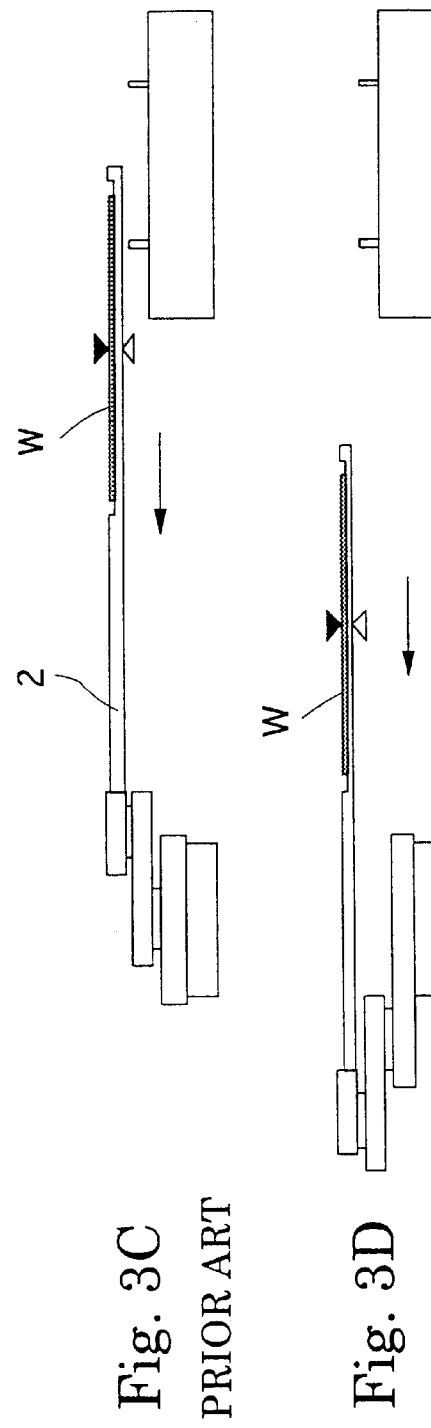
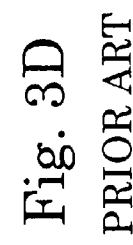
Fig. 3A PRIOR ART
Fig. 3B PRIOR ART
Fig. 3C PRIOR ART
Fig. 3D PRIOR ART

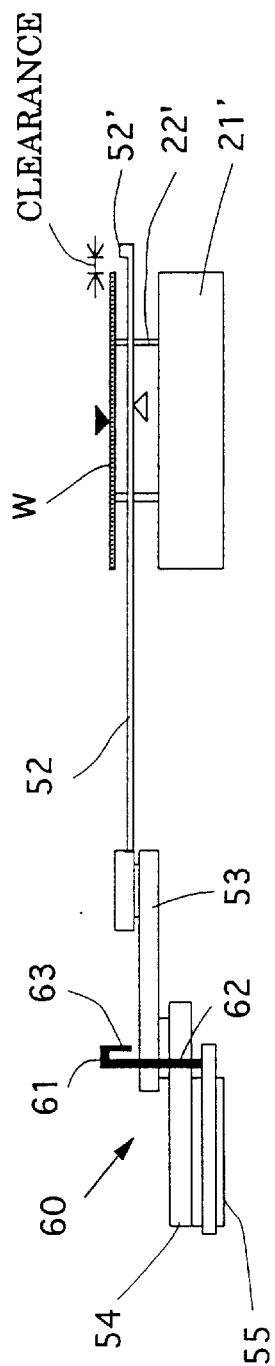
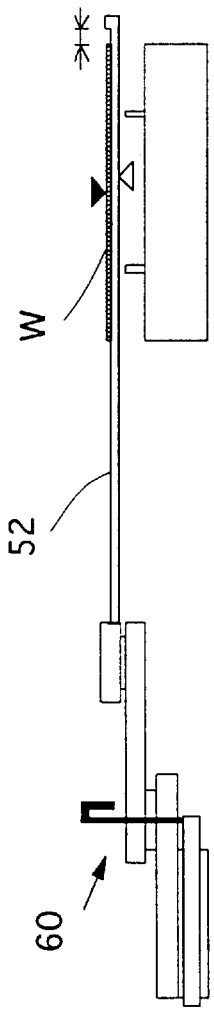
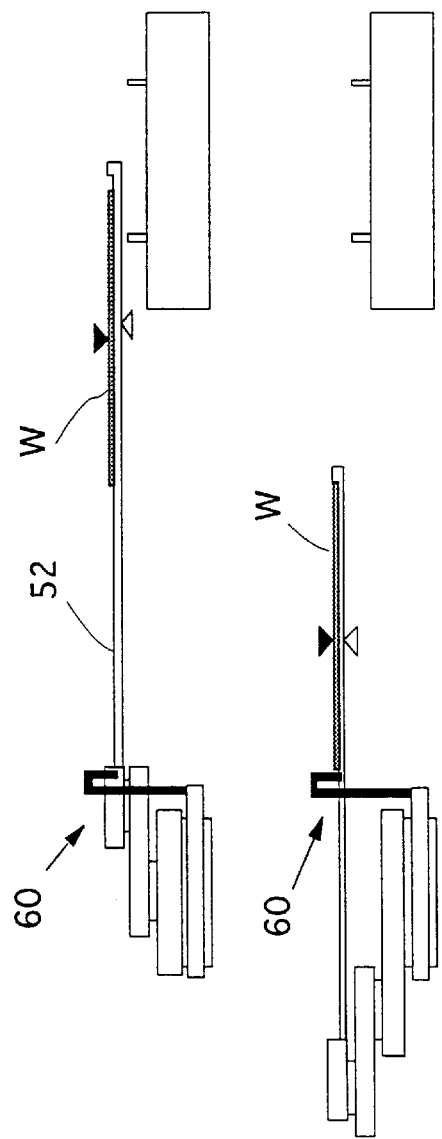
Fig. 7A
Fig. 7B
Fig. 7C
Fig. 7D

WAFER TRANSFER MECHANISM

BACKGROUND OF THE INVENTION

Field of the Invention

The present invention relates to an apparatus and a method for transferring a workpiece such as a semiconductor wafer to and from a storage section and, more particularly, relates to an apparatus and a method for transferring a workpiece to a prescribed position in a storage section.

A process of manufacturing semiconductors includes a step of transferring a sheet of semiconductor wafer from a cassette to a processing chamber or a step of transferring a sheet of semiconductor wafer from one processing chamber to another processing chamber. FIG. 1 is a perspective view of a transfer mechanism of the art typically used for such transferring steps.

The transfer mechanism 1 includes an arm 2 and a semiconductor wafer W can be held at a tip end portion thereof. At this portion of the arm 2, a recess for containing a wafer is provided to hold the wafer therein (see FIG. 3). Another end portion of the arm 2 opposite to the tip end portion is pivotally connected to one end portion of an auxiliary arm 3, and the other end portion thereof is pivotally connected to an auxiliary arm at one end portion thereof. The other end of the auxiliary arm 4 is connected to a rotating mechanism 5 for rotating the auxiliary arm 4. Although not shown, a guide is provided for allowing the arm 2 to be reciprocated only in the axial direction thereof. Consequently, when the auxiliary arm 4 is rotated by the rotating mechanism 5, the arm 2 can be reciprocated between a wafer supplying position and a retracted position of the arm while holding a wafer thereon (or not holding a wafer thereon when the wafer is processed in a processing chamber).

FIG. 2 is a perspective view of the transfer mechanism and shows a configuration thereof when the arm with a wafer held thereon is at the retracted position. The wafer can be transferred from one processing chamber to another processing chamber by rotating or moving the transfer mechanism as a whole while keeping such a configuration (hereinafter such rotation or movement is simply referred to as "movement").

FIGS. 3A, 3B, 3C and 3D and FIGS. 4A, 4B and 4C show operations of unloading and loading a wafer from and to a processing chamber using the transfer mechanism of the art. AS shown in FIG. 3A, a wafer W is supported by a plurality of pins 22 such that the center of the wafer W is aligned with the center of a wafer stage 21 in the processing chamber (not shown). After processing, in order to unload the wafer W therefrom, the arm 4 is rotated as shown in FIG. 1, and the arm 2 is simultaneously extended. The arm 2 extends to a position (an extended position) at which the center of the wafer holding portion of the arm 2 (indicated by a white triangle in the figure) is aligned with the center of the wafer W (indicated by a black triangle in the figure). Then, the pins 22 are moved downward as shown in FIG. 3B to place the wafer W in the recess of the arm 2. The arm 4 is then rotated to return the arm 2 to the retracted position while holding the wafer W thereon, as shown in FIG. 3C.

In order to subsequently process the wafer W, the transfer mechanism as a whole is moved (rotated) as shown in FIG. 2 while the center of the wafer holding portion is aligned with the center of the wafer W held thereon as shown in FIG. 3D, to direct the wafer W to a second processing chamber.

After directed to the second processing chamber, as shown in FIG. 4A, the arm 4 is rotated again to extend the arm 2 to a wafer processing position (at which the center of the wafer stage is aligned with the center of the wafer) in the second processing chamber. Then, the pins are moved upward to transfer the wafer to the wafer stage (FIG. 4B), and the arm 4 is then rotated to return the arm 2 to the retracted position. The processing position and the retracted position are stored in a controller for the transfer mechanism to repeat the unloading and loading operations for other wafers.

As an alternative to such a transfer mechanism as illustrated, there is a transfer mechanism with a vacuum absorption system, and a wafer is held on an arm using vacuum absorption. In this system, a wafer holding portion of the arm is in communication with a vacuum source to hold a wafer by acting the vacuum pumping force to the wafer positioned on the arm. Thus, because a wafer is held by the vacuum pumping force, the need for the recess on the arm to hold a wafer is eliminated so as to allow the arm to be made smaller, and a wafer can be moved or rotated at a high speed.

When a wafer is unloaded by a transfer mechanism of the art (FIG. 1), a wafer on the wafer stage is transferred to the recess of the arm by moving the pins downward so as to position a wafer in the recess of the arm. However, for example, in a processing chamber in which plasma is used for a predetermined process of a wafer, the wafer may be dislocated by the influence of electrical charges and the like caused by the generation of plasma.

The size of the recess formed on the arm 2 is slightly larger than a wafer to be contained therein (normally larger by a gap distance of about 2 mm or less in the radial direction) on the consideration of mechanical errors in the connection between the arms and in the rotating mechanism and the like. However, if the wafer is dislocated beyond the gap distance, the wafer is stranded on the step of the recess so that the wafer can not be contained in the recess, and thereby an error is caused in the wafer transfer. It seems that such a problem can be avoided by predicting the dislocation of the wafer and increasing the size of the recess. However, the wafer can be dislocated inside the recess, and as a result, the reliability of positional accuracy and the repeatability are reduced.

In addition, because the size of the recess is larger than that of a wafer, the wafer can be slid inside the recess during the reciprocation and the rotation of the arm at the retracted position, and thereby the wafer can be dislocated. The speed of movement (rotation) of the arm must be reduced to prevent such a dislocation of the wafer, and thus, it can not be achieved to increase the wafer transfer speed and to shorten the time taken for transferring the wafer. Meanwhile, the arm using a vacuum absorption system does not have such a problem and allows a high transfer speed. However, it is likely to produce particles when a surface of a wafer is strongly contacted with the arm by the vacuum pumping force. Inherently, such a system is only used in the atmosphere.

The invention has been conceived to solve the above-described problems, and it is an object of the invention to provide a mechanism and a method for transferring a workpiece so as to place the workpiece at a prescribed position on an arm member for holding the workpiece without any additional step.

It is another object of the invention to provide a mechanism and a method for transferring a workpiece so as to easily transfer the workpiece to an arm member and place the workpiece at a prescribed position on the arm.

It is still another object of the invention to provide a mechanism and a method for transferring a wafer so as to transfer the wafer from one storage section to another storage section at a high speed.

It is still another object of the invention to provide a mechanism and a method for transferring a workpiece so as to transfer the workpiece under not only a normal pressure condition but also a vacuum condition.

It is still another object of the invention to provide a mechanism and a method for transferring a workpiece which can be adapted for existing apparatuses.

SUMMARY OF THE INVENTION

A transfer mechanism according to the invention for transferring a workpiece to and from a storage section so as to achieve the above-mentioned objects comprises:

(a) an arm member for holding a workpiece having a projection at the end portion thereof, the projection coming into contact with an edge of the workpiece;

(b) a movement mechanism for reciprocating the arm member with the workpiece held thereon between its retracted position and its extended position to transfer the workpiece to and from the storage section; and (c) a positioning member for positioning the workpiece held on the arm member at a prescribed position on the arm member, the positioning member being disposed in the vicinity of the arm member and coming into contact with an edge of the workpiece.

When the arm member is moved to the retracted position by operating the movement mechanism, the positioning member contacts with the edge of the workpiece held on the arm member to block only the movement of the workpiece, thereby placing the workpiece at the prescribed position on the arm member.

In order to transfer a workpiece from one storage section to another storage section, the movement mechanism includes moving means for moving the arm member to each storage section while keeping the arm member in its retracted position. The positioning member is connected to the moving means.

A method according to the invention is a method for transferring a workpiece from one storage section to another storage section, and the method comprises the following steps (a) to (e).

(a) An arm member for holding a workpiece is inserted into one storage section. The arm member has a projection at its tip end, and the projection can be contacted with an edge of the workpiece. The arm member is inserted into this storage section by extending the arm member to its extended position. At this extended position, a clearance is defined between the edge of the workpiece contained in the storage section and the projection of the arm member. Then, the workpiece is transferred on the arm member.

(b) The arm member is retracted until the edge of the workpiece transferred thereon is contacted with a positioning member located in the vicinity of the arm member.

(c) The arm member is further retracted until the arm member arrives at its retracted position while keeping the positioning member in contact with the workpiece on the arm member so as to block the movement of the workpiece. At the retracted position of the arm member, the workpiece is placed at a prescribed position on the arm member.

(d) The arm member is moved toward another storage section while keeping the arm member in the retracted position.

(e) The arm member is inserted into the other storage section while holding the workpiece held at the prescribed position on the arm member.

BRIEF DESCRIPTION OF THE DRAWINGS

FIGS. 3A, 3B, 3C and 3D show wafer unloading operations from a processing chamber using the transfer mechanism shown in FIG. 1.

FIGS. 7A, 7B, 7C and 7D show wafer unloading operations from a processing chamber using the transfer mechanism shown in FIG. 5.

DETAILED DESCRIPTION OF PREFERRED EMBODIMENT

Figure 5:
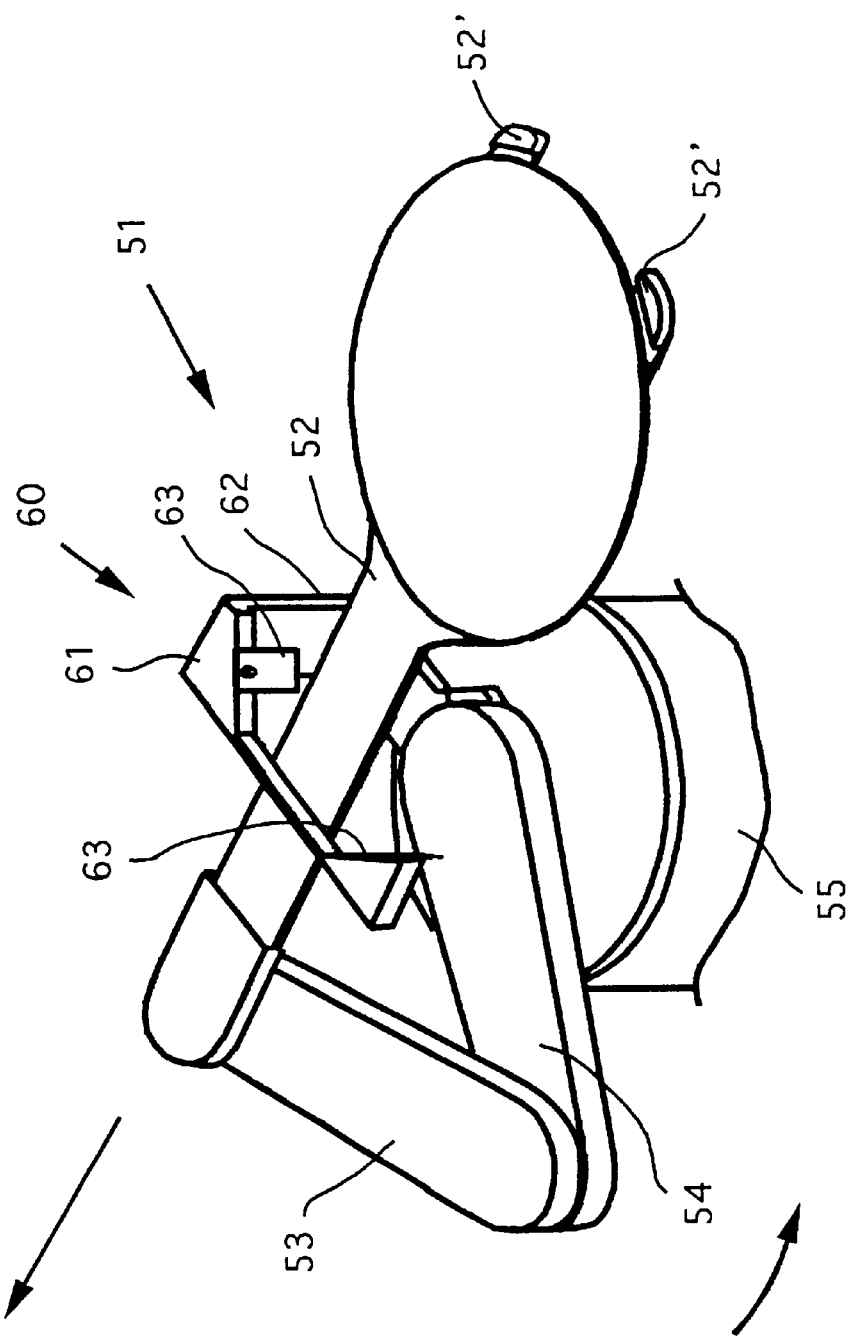
FIG. 5 is a perspective view of a transfer mechanism according to the invention.

FIG. 5 is a perspective view of a transfer mechanism 51 according to the invention. It is different from the transfer mechanism 1 of the art shown in FIG. 1 that (1) it includes no recess on an arm 52 and only includes a projection 52' having a configuration in compliance with the peripheral edge of a semiconductor wafer W provided on the end thereof and (2) it includes a positioning member 60 which is positioned in the vicinity of the arm when the arm is in a retracted position.

Figure 1:
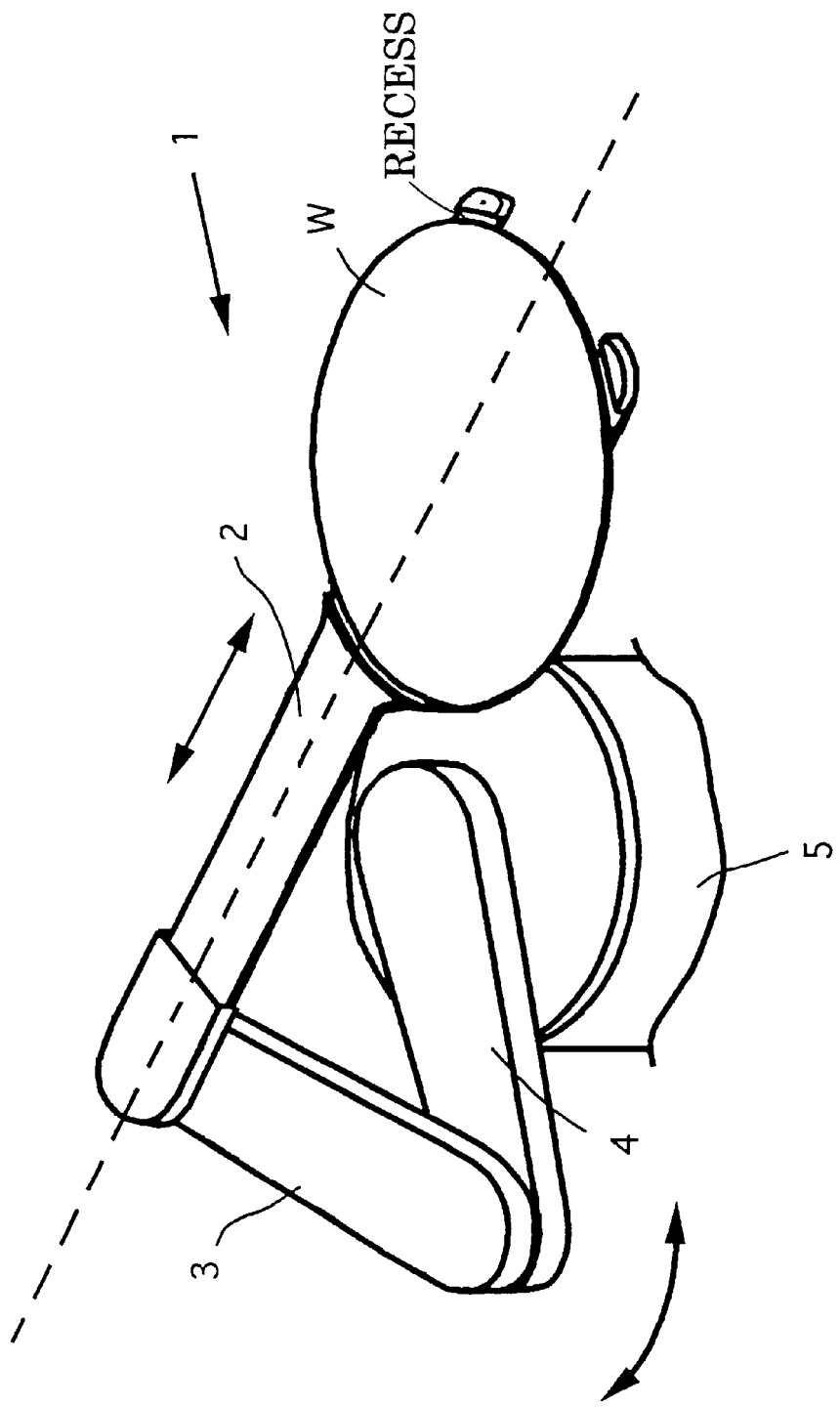
FIG. 1 is a perspective view of a transfer mechanism of the art.
Figure 2:
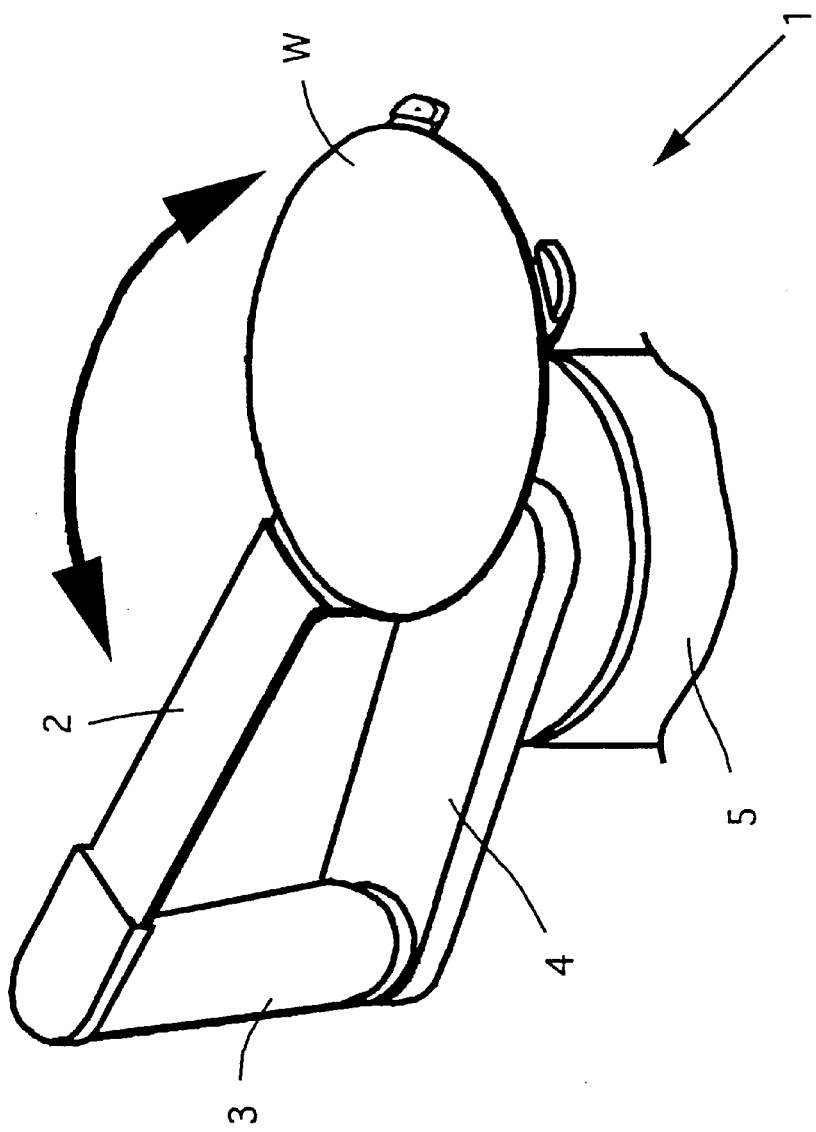
FIG. 2 is a perspective view of the transfer mechanism of the art shown in FIG. 1 and shows the rotation of the mechanism as a whole.
Figures 4A, 4B, 4C:
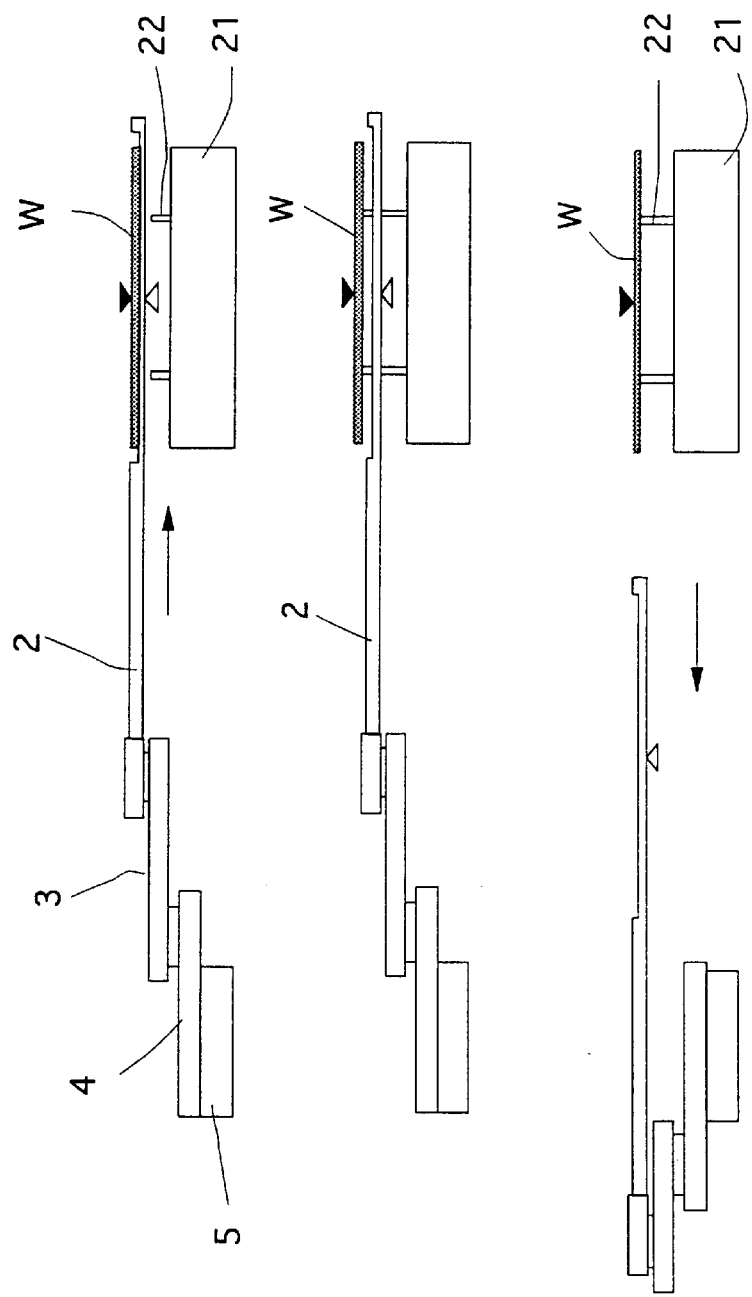
FIGS. 4A, 4B and 4C show wafer loading operations to a processing chamber using the transfer mechanism shown in FIG. 1.

As described with reference to FIG. 1, the arm 52 of the transfer mechanism 51 according to the invention is also connected to a rotating mechanism 55 through two auxiliary arms 53 and 54 so as to reciprocate between an extended position and a retracted position. Also, a guide (not shown) is provided for allowing the arm 52 to be reciprocated only in the axial direction thereof. Consequently, when the arm 54 is rotated by the rotating mechanism 55, the arm 52 can be reciprocated through the arm 53.

As illustrated, the wafer holding portion of the arm 52 according to the invention is wider than a shaft portion thereof and includes two projections 52' at the end thereof. Since the projections 52' come into contact with an edge of a wafer W. it is desirable to provide elastic members (e.g., spring members) on each wafer contacting portion thereof so as to prevent damage the edge of the wafer W.

The positioning member 60 is connected to the rotating mechanism 55 and is positioned in the vicinity of the arm 52. The positioning member 60 comprises a horizontal portion 61 positioned above the arm 52 and a vertical portion 62 which fixes the horizontal portion on the rotating mechanism 55. Both ends of the horizontal portion 61 are expanded so as to form a trapezoidal recess in the horizontal portion 61. On this recess, elastic pieces 63 (e.g., spring element) are preferably attached and come into elastic contact with an edge of a wafer. Although the elastic pieces are preferable for elastically contacting with a wafer W, such pieces are not essential, and as alternative, the trapezoidal recess of the horizontal portion may be contacted with an edge of a wafer.

While the horizontal portion 61 is formed with a trapezoidal recess to be in contact with an edge of a wafer at two positions as the illustrated, the horizontal portion 61 may be designed so as to contact with a wafer at only one position or more than three positions. As the number of such contact positions is increased, it is easier to position a wafer W at a prescribed position on the arm 52 as will be described later. However, it becomes difficult to accommodate a wafer having different diameter.

Figure 6:
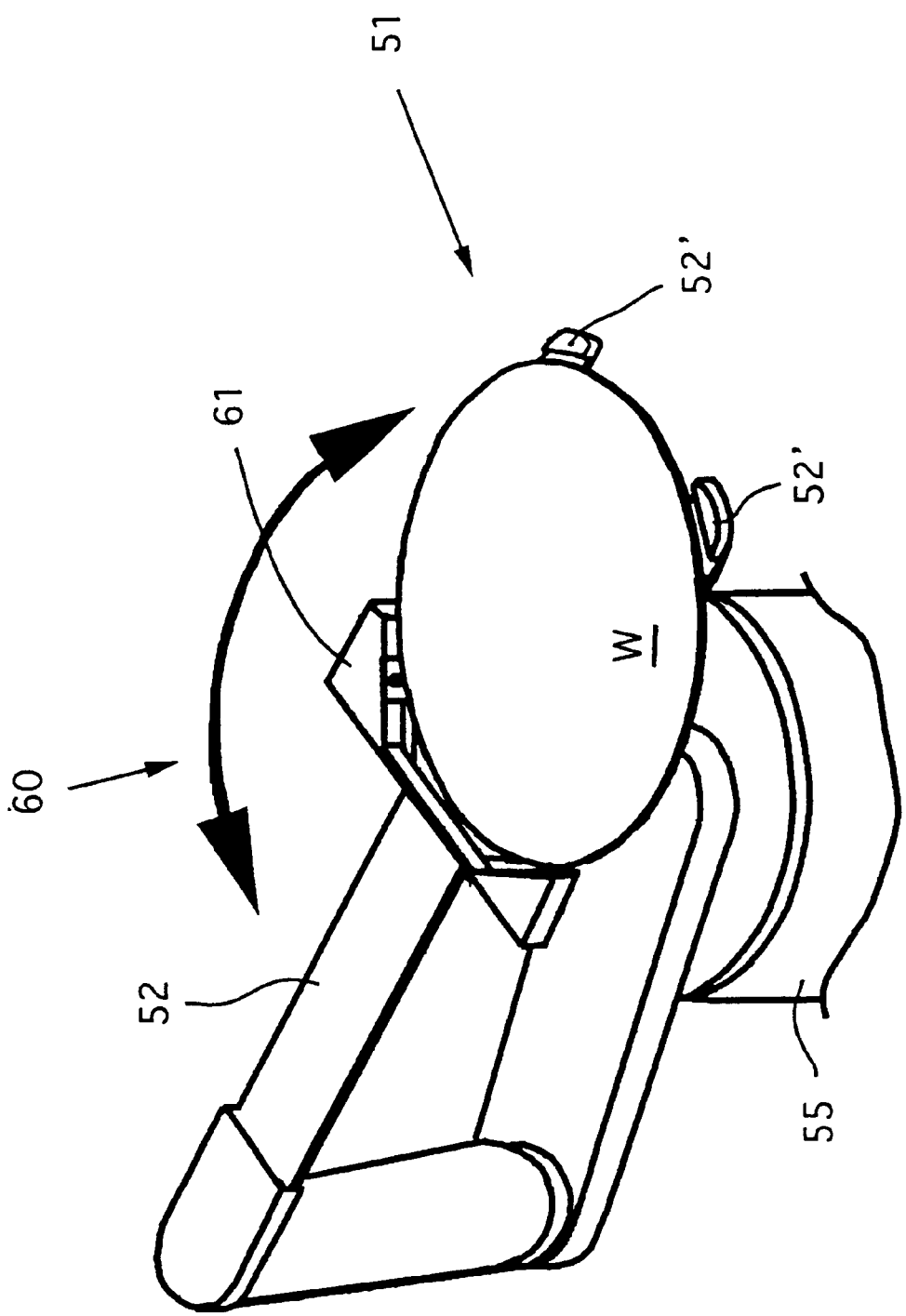
FIG. 6 is a perspective view of the transfer mechanism shown in FIG. 5 and shows the rotation of the mechanism as a whole.

In the transfer mechanism 51 having the positioning member 60, when the arm 54 is rotated by the rotating mechanism 55 so as to retract the arm 52 through the arm 53, the wafer W held on the arm 52 is retracted together with the arm 52 and is then brought into contact with elastic members 63 on the positioning go member 60, as shown in FIG. 6. When the arm 52 is further retracted, the positioning member 60 blocks the wafer W so as not to move with the arm. Then, the wafer W is pushed toward the projections 52', 52' on the arm 52 and is then sandwiched between the projections 52', 52' and the elastic members 63 on the positioning member. It is understood that if this wafer position is made to correspond to a prescribed position of the wafer on the arm 52, the wafer is always positioned at the prescribed position by retracting the arm 52.

Since the wafer W is secured at the prescribed position on the arm 52 by the projections 52' and positioning member 60, the wafer W will not be dislocated from the prescribed position, even though the transfer mechanism 51 is rotated as shown in FIG. 6 or translated as a whole (not shown).

A description will now be made with reference to FIGS. 7A, 7B, 7C and 7D and FIGS. 8A, 8B and 8C on operations of unloading a wafer from a processing chamber and loading it to another processing chamber using the above-described transfer mechanism 51 according to the invention.

In order to unload a processed wafer in the processing position on the wafer stage 21 in a processing chamber, as shown in FIG. 7A, the arm 52 is extended into the processing chamber such that the arm 52 is passed through pins 22' and below the wafer W and is extended to a position (an extended position) at which a predetermined gap or clearance is defined between the projections 52' on the arm 52 and an edge of the wafer on the processing position. This clearance is provided in order to strand the wafer on the projections 52' even though the wafer is dislocated by, for example, the influence of electric charges caused by the generation of plasma. The clearance is normally about 2 mm.

The pins 22' are then moved downward as shown in FIG. 7B to transfer the wafer W to the arm. In general, the center of the wafer (indicated by a black triangle in FIG. 7B) does not align with a prescribed position of the wafer on the arm (indicated by a white triangle in FIG. 7B). Then, the arm 54 is rotated by the rotating mechanism 55, and the arm 52 is simultaneously retracted to eject the wafer W from the processing chamber (FIG. 7C).

During the arm 52 is retracted with the wafer W held thereon, the wafer W comes into contact with the elastic pieces 63 on the positioning member 60. The elastic pieces 63 block only the movement of the wafer W on the arm 52. The arm 52 is further retracted, and thereby, the elastic pieces 63 push the wafer W toward the projections 52' on the arm 52. When an edge of the wafer W comes into contact with the projections 52', the rotation of the arm 54 is stopped to terminate the retraction of the arm 52 (FIG. 7D). Thus, the wafer W is positioned at the prescribed position on the arm 52, i.e. the center of the wafer W is aligned with the center of the wafer to be positioned at the prescribed position on the arm 52.

When the wafer is directed to another processing chamber, the transfer mechanism as a whole is rotated as shown in FIG. 6. Since the wafer is sandwiched between the positioning member 60 and projections 52', the wafer is not dislocated from the prescribed position by the rotation thereof, and thus, the wafer can be directed to the other processing chamber at a high speed. Note that the positioning member 60 must be connected to the rotating mechanism 55 so as to rotate together with the arm 52. While the transfer mechanism 51 as a whole is rotated in order to direct the wafer to the other processing chamber in this embodiment, it is obvious that the transfer mechanism 51 may be moved to a position at which the wafer can be loaded to the other processing chamber, using moving means for translating the transfer mechanism 51 as a whole.

Figures 8A, 8B, 8C:
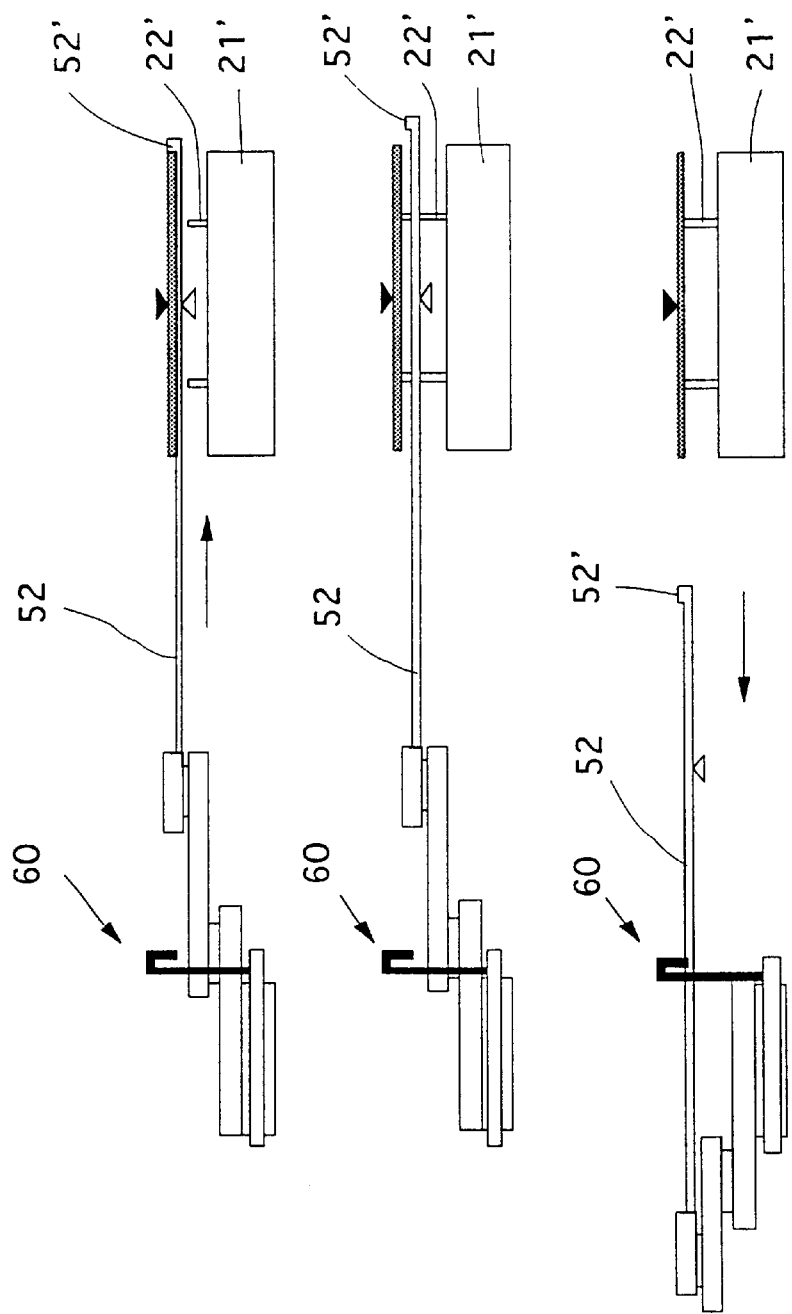
FIGS. 8A, 8B and 8C show wafer loading operations to a processing chamber using the transfer mechanism shown in FIG. 5.

When the wafer W is directed to the other processing chamber, the arm 52 extends into the processing chamber as shown in FIG. 8A. The arm 52 is extended until the center of the wafer W (indicated by a white triangle in FIG. 8A) is aligned with the center of the wafer stage 21' (indicated by a block triangle in FIG. 8A).

Since, as described above, the wafer on the arm is sandwiched between the positioning member and projections 52' so as to position and keep the wafer at the prescribed position, the center of the wafer W on the arm can be aligned with the center of the wafer stage 21' by simply extending the arm 52. Then, the pins 22' are moved upward, and the arm 52 is then retracted (FIGS. 8B and 8C), and thereby the wafer W' is positioned at a desired position or a processing position on the wafer stage 21'.

As described above, since the wafer is sandwiched between the projections of the arm and the positioning member, the wafer can be accurately positioned in a processing chamber by only extending the arm. If the high accuracy in positioning is not required in the wafer transfer, a gap may be left between an edge of the wafer and the projections during the retraction of the arm. However, in a wafer process, it is desirable that this gap is 2 mm at the maximum and is preferably 1.5 mm or less.

While the above-described embodiment refers to a wafer transfer from one processing chamber to another processing chamber, the transfer mechanism according to the invention is not limited to this and may be used for a wafer transfer from a cassette to a processing chamber and vice versa. It will also be understood that the workpiece to be transferred is not limited to a wafer.

Since the generation of particles is a serious problem in a semiconductor wafer transfer, the transfer speed, the configuration of the arm, and the configurations and the elasticity of the projections and the positioning member that come into contact with a wafer are appropriately chosen to prevent the generation of particles.

According to the invention, an arm member for transferring a workpiece only has projections on the end thereof, and there is no need for a recess for containing a workpiece therein. This eliminates the need for accurately positioning the arm member to the position of a workpiece contained in a storage section when the workpiece is transferred to the arm member. The transfer control is also simplified. A workpiece is positioned at a prescribed position on the arm member during a retracting operation in a transfer process and can therefore be transferred to a desired position by simply extending the arm member.

Since a workpiece is sandwiched by the projections on the arm member and the positioning member so as to hold the workpiece on the arm member, the workpiece is not dislocated from a prescribed position on the arm member. This makes it possible to transfer the workpiece to another storage section at a high speed while holding the workpiece at the prescribed position on the arm member. This allows transfer speed to be increased.

The present invention is applicable for transferring a workpiece in not only a normal pressure condition but also a low pressure condition, because a workpiece is held without the vacuum pumping force.

The present invention can be implemented using an existing transfer mechanism which uses an arm member with substantially no modification thereof, although a positioning member is required.

While we-have illustrated and described the preferred embodiments of-our invention, it is to be understood that these are capable of variation and modification, and we therefore do not wish to be limited to the precise details set forth, but desire to avail ourselves of such changes and alternations as fall within the purview of the following claims.

The entire disclosure of Japanese Patent Application No. Heisei 10(1998)-206082 filed on Jul. 22, 1998 including specification, claims, drawings and summary are incorporated herein by reference in its entirety.

What is claimed is:

1. A transfer mechanism for transferring a workpiece to or from a storage section, comprising:
   (a) an arm member having a tip end portion for supporting a workpiece thereon, said tip end portion having at its distal end at least one projection adapted to be in contact with an edge of the workpiece for restricting movement of the workpiece toward the distal end;
   (b) a movement mechanism for reciprocally moving the arm member between its retracted position and its extended position, while supporting said workpiece on said arm member, to transfer said workpiece to or from said storage section; and
   (c) a positioning member for contacting an edge of the workpiece and moving the workpiece on the arm member in relation to the arm member toward the distal end when the arm member retracts, said positioning member being disposed in tracks of the arm member movement, at a fix position free from movement of the arm member, wherein when said arm member is moved by said movement mechanism toward said retracted position, the edge of said workpiece supported on said arm member contacts said positioning member to block the movement of said workpiece and to place the workpiece on said arm member at a prescribed position between the projection and the positioning member.

2. The transfer mechanism of claim 1, wherein part of at least one of said positioning member and said projection, said part being contacted with the edge of said workpiece, has an elastic member.

3. The transfer mechanism of claim 1, wherein when said workpiece is placed at said prescribed position by moving said arm member toward said retracted position, said workpiece is contacted with and sandwiched between said projection and said positioning member.

4. The transfer mechanism of claim 1, wherein when said workpiece is placed at said prescribed position by moving said arm member toward said retracted position, a clearance is defined between the edge of said workpiece and said projection.

5. The transfer mechanism of claim 4, wherein said clearance is a distance of 2 mm or less.

6. The transfer mechanism of claim 1, wherein said storage section is a processing chamber, and said transfer mechanism transfers said workpiece, which is placed at said prescribed position by moving said arm member to said retracted position, toward a processing position inside said processing chamber by moving said arm member to said extended position.

7. The transfer mechanism of claim 3 or 4, wherein a plurality of storage sections are provided, and said transfer mechanism has moving means for moving said arm member toward each said storage section while keeping said arm member in said retracted position, and said positioning member is connected to said moving means.

8. A method for transferring a workpiece from one storage section to another storage section, said method comprising the steps of:
   (a) inserting an arm member having a tip end portion for supporting a workpiece thereon, into one storage section by extending the arm member to its extended position, said tip end portion having at its distal end at least one projection adapted to be in contact with an edge of the workpiece for restricting movement of the workpiece toward the distal end, at which extended position a clearance is defined between the edge of the workpiece contained in the storage section and the projection of the arm member, and then transferring the workpiece onto the arm member;
   (b) retracting said arm member until the edge of said workpiece, which is transferred thereon, is contacted with a positioning member disposed in tracks of the arm member movement, at a fix position free from movement of the arm member;
   (c) further retracting said arm member until said arm member arrives at a retracted position, said positioning member being in contact with said workpiece and blocking the movement thereof to move the workpiece on the arm member in relation to the arm member toward the distal end, so that said workpiece is places at a prescribed position on said arm member between the projection and the positioning member;

(d) moving said arm member toward said another storage section while keeping said arm member in said retracted position; and (e) inserting said arm member into said another storage section while supporting said workpiece at said prescribed position on said arm member.

9. A transfer method as claim 8, wherein said clearance is greater than or equal to 2 mm.

10. A transfer method as claim 8, wherein said workpiece is sandwiched between said projection member and said positioning member when disposed at said prescribed position on said arm member.

11. The method of claim 8, wherein when placing said workpiece at said prescribed position on said arm member, a gap is defined between the edge of said workpiece and said projection member, and the gap is 1.5 mm or less.

12. The method of claim 8, wherein said another storage section is a processing chamber, and said arm member is inserted into said processing chamber until it arrives at a processing position of said processing chamber.

* * * * *